United States Patent [19]

Yagi

[11] Patent Number: 4,650,267

[45] Date of Patent: Mar. 17, 1987

[54] DEVICE FOR FIXING ELECTRONIC DISPLAY

[75] Inventor: Masaru Yagi, Tsushima, Japan

[73] Assignee: Kitagawa Industries Co., Ltd., Nagoya, Japan

[21] Appl. No.: 815,470

[22] Filed: Jan. 2, 1986

[30] Foreign Application Priority Data

Jan. 17, 1985 [JP] Japan .............................. 60-5216[U]

[51] Int. Cl.⁴ .............................................. H05K 1/00
[52] U.S. Cl. ................................................ 339/17 CF
[58] Field of Search ................. 269/254 R; 339/17 C, 339/17 CF; 248/27.1, 510, DIG. 4; 24/458

[56] References Cited

U.S. PATENT DOCUMENTS

| 3,922,051 | 11/1975 | Reynolds | 339/17 C |
| 3,963,316 | 6/1976 | Williams | 339/17 C |
| 4,357,061 | 11/1982 | Crosby | 339/17 C |
| 4,504,105 | 3/1985 | Barkus et al. | 339/75 MP |
| 4,527,312 | 7/1985 | Ruehl et al. | 24/458 |

Primary Examiner—Frederick R. Schmidt
Assistant Examiner—Judy J. Hartman
Attorney, Agent, or Firm—Oblon, Fisher, Spivak, McClelland & Maier

[57] ABSTRACT

A device for fixing an electronic display, in which the platelike electronic display 2 is put on a flat platelike rest 1 and supported on a printed wiring board 37 by support members (43 and 44) and which includes holding members (11 and 12) which are integrally conjoined to a pair of opposed edges of the platelike rest 1 by flexible coupling portions (8 and 9) and which are bent to hold the electronic display 2 after the display 2 is put on the rest 1, engaging elements (15, 16, 17 and 18) provided on the holding members (11 and 12) and engaged with engaging members (21, 22, 23 and 24) provided on the platelike rest 1, to fix the bent holding members (11 and 12), positioning members 6 which project from another edge of the platelike rest 1 and with which an edge of the electronic display 2 is brought into contact, and clamping members (28 and 29) which are provided on the holding members (11 and 12) and which are brought into pressure contact with the ends of the electronic display 2 from opposite the positioning members 6 when the holding members (11 and 12) are bent to hold the display 2.

8 Claims, 7 Drawing Figures

DEVICE FOR FIXING ELECTRONIC DISPLAY

BACKGROUND OF THE INVENTION

1. Technical Field

The present invention relates to a device for fixing an electronic display, particularly to a device for fixing an electronic display with high stability and accuracy by a simple attaching operation.

2. Background Art

Conventionally, an electronic display such as a liquid-crystal or fluorescent display for digitally or graphically showing a volume of sound, frequency, revolution speed, time measurement result or the like is attached to a home electric appliance such as a television set, radio, video tape recorder, microwave oven and stereo, a measuring instrument or the like. The electronic display is normally mounted to be coincident with an opening of the casing of the appliance or the like so that indications can be seen from outside the appliance or the like. The number of signal lines increases according to the increase in the quantity of informantion to be shown on the electronic display. There is even an electronic display with several tens of terminals. In order to facilitate wiring to the terminals, they are often attached directly to a printed wiring board by soldering or the like. To attach such an electronic display, a two-side-sticking tape or adhesive agent is stuck to the printed wiring board, a buffer made of cholroprene sponge or the like is stuck to the tape or adhesive agent, another two-side-sticking tape or adhesive agent is stuck to the buffer, the back of the electronic display is stuck to the latter two-side-sticking tape or adhesive tape, and the terminals of the electronic display are inserted into the insertion holes of the printed wiring board so that the electronic display is supported. However, such problems mentioned next. Firstly, it is not easy to attach the electronic display. When the display is stuck instead of being attached by a fixation device, it is troublesome to apply an adhesive agent or remove covering paper from a two-side-sticking tape. Especially, when the adhesive agent is used, it is time-consuming to dry the agent. For these reasons, automation is difficult and the number of manufacturing steps is large, so that the productivity cannot be enhanced. Secondly, it is difficult to position the electronic display. This matters particularly in the case that there is a certain distance between the printed wiring board and an external casing so that the electronic display is attached off the printed wiring board. In the case, it is likely that some of the terminals of the display are distorted to decrease its reliability as the attached position of the display is forcibly corrected in order to make the display coincident with a display opening frame after the sticking of the display. Thirdly, the density of mounting on the printed wiring board is low. When the electronic display is directly mounted on the printed wiring board, a space which would not be required if the display were attached to a casing needs to be provided on the printed wiring board, so that the density of mounting of other electronic displays on the printed wiring board is lowered due to the space. When the electronic display is attached to the casing, a step of connecting the terminals of the display to the wiring on the printed wiring board is needed, and it is inconvenient to remove the electronic display for maintenance work or the like.

SUMMARY OF THE INVENTION

The object of the present invention is to provide an electronic display fixation device by which an electronic display can be easily attached to a printed wiring board in such a manner that exact positioning is enabled and the density of mounting of electronic display on the printed wiring board is heightened.

The present invention has a means for solving the problems, to attain the object. The constitution is such that the electronic display fixation device, in which the platelike electronic display is put on a flat platelike rest and supported on the printed wiring board by support members, includes holding members which are integrally conjoined to a pair of opposed edges of the platelike rest by flexible coupling portions and which are bent to hold the electronic display after the is put on the platelike rest; engaging elements which are provided on the holding members and engaged with engaging members provided on the platelike rest, to fix the bent holding members; positioning members which project from another edge of the platelike rest and with which an edge of the electronic display is brought into contact; and clamping members which are provided on the holding members and which are brought into pressure contact with the ends of the electronic display from opposite the positioning members when the holding members are bent to hold the display. The platelike rest has a form corresponding to that of indications on the display, and is fixed at a prescribed height from the printed wiring board by the support members such as snaps which have engaging projections, the tip of each of which is shaped as an arrowhead. The holding members are integrally conjoined to the pair of opposed edges of the platelike rest by the flexible coupling portions. It is convenient in reducing the number of manufacturing steps, that the coupling portions are formed at a small thickness and the holding members and the coupling portions are integrally formed. However, it is also no problem that the holding members and the platelike rest are separately manufactured and coupled to each other so that the holding portions of the members can be bent. The holding members may be attached either to the opposed edges of the platelike rest in the direction of its height or to those of the rest in the direction of its length. The engaging elements on the holding members and the engaging members on the rest constitute pairs, and may be in any combination if they are engaged with each other when the holding members are bent to hold the electronic display. For example, engaging claws may be provided at the tips of the engaging elements in order to be engaged with the engaging members. The positioning members serve to position the electronic display on the platelike rest. While the holding members conjoined to the pair of opposed edges serve to position the display in the direction from one of the edges to the other, the positioning members provided at other edges serve to position the display in the other direction in cooperation with the clamping members on the holding members. If the positioning members are made of an elastic material, the electronic display is preferably pinch-held by a prescribed force when the display is positioned. The positioning members may be integrally formed on the platelike rest.

All the members and elements described above may be made from various kinds of plastic such as a condensation polymer of polyamide type and a condensation polymer of polyester type. These members and elements may be either separately manufactured and then combined together, or integrally formed to reduce the number of manufacturing steps.

In the electronic display fixation device provided with the above-mentioned constitution according to the present invention, the electronic display is put on the platelike rest and supported on the printed wiring board by the support members, the holding members integrally conjoined to the pair of opposed edges of the platelike rest by the flexible coupling portions are bent to hold the display, and the display is pinch-held by the clamping members and the positioning members provided at the other edges, so that the electronic display is surely fixed with high accuracy as to the attached position of the display.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying.

DETAILED DESCRIPTION OF PREFERRED EMBODIMENTS

Figure 1:
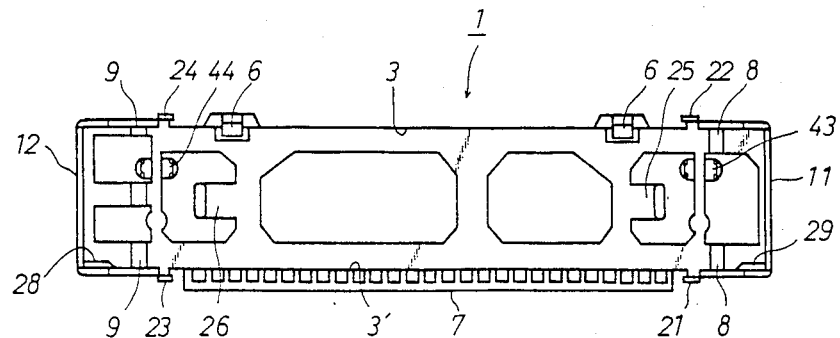
FIG. 1 shows a plan view of a fixation device which is an embodiment of the present invention.

The embodiments of the present invention are hereinafter described in detail referring to the drawings.

Figure 2:
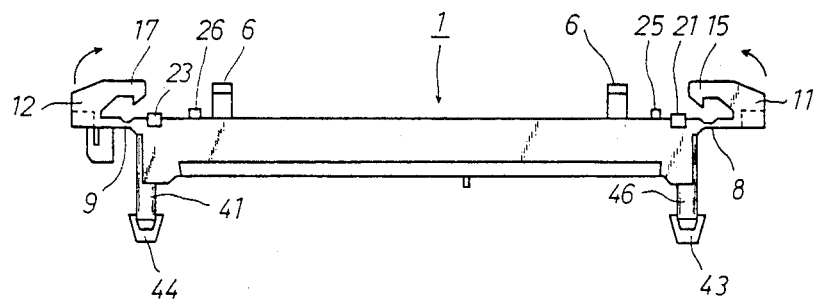
FIG. 2 shows a front view of the fixation device.
Figure 3:
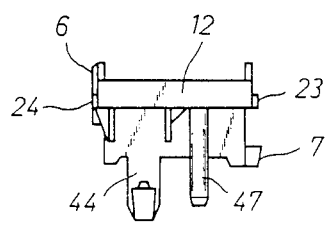
FIG. 3 shows a left-hand side view of the fixation device.
Figure 4:
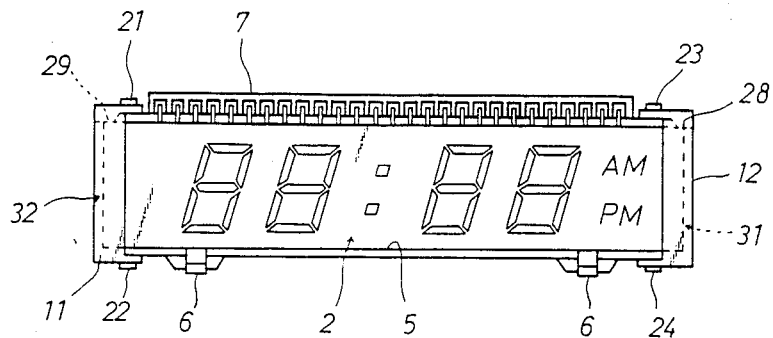
FIG. 4 shows a plan view indicating the fixation of an electronic display by the fixation device.
Figure 5:
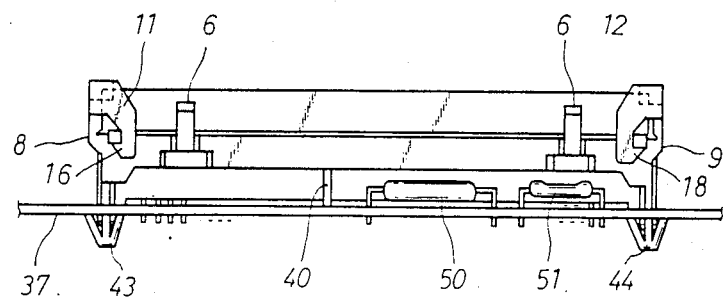
FIG. 5 shows a front view of the fixation.

FIG. 1 shows a plan view of a fixation device which is an embodiment of the present invention. FIG. 2 shows a plan view of the fixation device. FIG. 3 shows a left-hand side view of the fixation device. FIG. 4 shows a plan view indicating the mounting of an electronic display. FIG. 5 shows a plan view of the mounting. The vertical direction of the fixation device shown in FIGS. 1 and 2 is opposite to that of the device shown in FIGS. 4 and 5. Shown at 1 in these drawings is a platelike rest which is formed on the top of the fixation device body molded from synthetic resin and has a flat surface, on which the electronic display 2 is put. Two projections 6, which come into contact with a longitudinal edge 5 of the electronic display 2, are privided at one longitudinal edge 3 of the platelike rest. A terminal-holding frame 7, which has holes for guiding the insertion of the many terminals (leads) of the display 2, is integrally provided at another longitudinal edge 3′ of the reset 1. Small-thickness portions 8 and 9 are formed as coupling portions at both the ends of the rest 1 so that the portions extened along the ends. Holding members 11 and 12 are provided on the portions 8 and 9 are urged so that the holding members can be bent in directions shown by arrows in the drawing. Each of the holding members 11 and 12 is shaped as a box or frame. Engaging claws 15, 16, 17 and 18 are provided as engaging elements on the side frames of the holding members 11 and 12. When the holding members 11 and 12 are bent in the directions shown by the arrows shown in FIG. 2, so that the holding members are almost vertically oriented as to FIG. 2, to engaging claws 15, 16, 17 and 18 are engaged with claw receivers 21, 22, 23, and 24 integrally provided protrusively toward locations beside the edges 3 and 7 of the platelike rest 1 (refer to FIG. 5). Shown at 25 and 26 are small elements which act as plate spring to apply small upward forces to bring the holding members 11 and 12 into tight contact with the electronic display 2 when the display is fixed by the holding members. Projections 28 and 29 are provided in the side frames of the holding members 11 and 12 so that the projections are intergrated with the holding members and constitute clamping members. Projections 28 and 29 come into pressure contact with the electronic display 2 from opposite the projections 6. When the holding members 11 and 12 are bent to engage the engaging claws 15, 16, 17 and 18 with the claw receivers 21, 22, 23 and 24, the projections 6, 28 and 29 position the display 2 in the direction of its height and fix the display. The form of each of the projections 28 and 29 is shown in FIG. 6.

The body of the electronic display 2 is firmly fixed at both the ends 31 and 32 on the platelike rest 1 by the holding members 11 and 12 each formed as a box or frame, so that the terminals of the display 2 are not loaded themselves when the display is fixed. FIGS. 4 and 5 show the fixation of the electronic display 2. A support member for stably attaching the platelike rest 1 to the printed wiring board of the chassis of an electric appliance or the like is provided on the back of the rest 1. A reinforcing rib 40, which has a prescribed height for keeping a desired vertical distance between the printed wiring board 37 and the rest 1, is integrally provided as the support member on the halfway portion of the back of the rest 1. Snaps 43 and 44 and support legs 46 and 47 are provided as support members at both the ends of the back of the fixation device 1 in such a manner that the snaps and the support legs are integrated with the platelike rest 1. The fixation device 1 is fastened to the printed wiring board 37 by inserting the snaps 43 and 44 and the support legs 46 and 47 into attaching holes previously provided in the printed wiring board. The snaps 43 and 44 are furnished with check elements whose tips are shaped as arrowheads, to surely fasten the fixation device 1 as a whole.

In the embodiment having the above construction, the electronic display 2 put on the platelike rest 1 is fixed by bending the holding members 11 and 12 at both the ends to engage the engaging claws 15, 16, 17 and 18 of the holding members with the claw receivers 21, 22, 23 and 24. At that time, the display 2 is firmly fixed in an exact position with regard to the direction of the height as well as that of the length, by the two projections 6 at the longitudinal edge 3 and the projections 28 and 29 provided in the holding members 11 and 12. The fixation device is attached to the printed wiring board 37 by the snaps 43 and 44 and the support legs 36 and 47. As a result, the electronic display 2 is exactly attached in a prescribed position on the printed wiring board 37, and the position of the display 2 deviates neither in the direction of the length nor in that of the height. For that reason, the display 2 can be exactly positioned to an external casing or the like not shown in the drawings.

Figure 6:
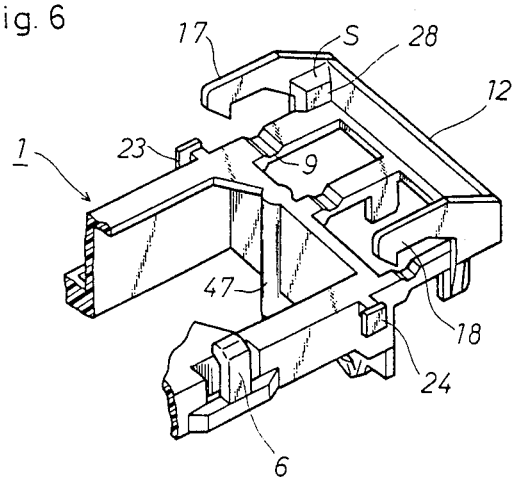
FIG. 6 shows an oblique view indicating the forms of projections 28 and 29 provided on holding members 11 and 12.

Since the projections 28 and 29 formed in the holding members 11 and 12 and having slopes shown at S in FIG. 6 are later brought into pressure contact with the electronic display 2 previously put on the platelike rest 1, it is easy to bend the holding members 11 and 12 for the engagement.

The fixation device which is the embodiment of the present invention has the terminal-holding frame 7 which holds the terminals of the electronic display 2 to true up the terminals to facilitate the insertion of the terminals into the terminal holes of the printed wiring board 37.

Since a relatively large space is left under the fixation device, electronic displays such as an integrated circuit 50 and a resistor 51 can be also mounted as shown in FIG. 5. For that reason, the density of mounting of displays on the printed wiring board can be enhanced.

Since the fixation device is integrally formed as a whole including the small-thickness portions 8 and 9 as coupling portions, it is easy to manufacture the device, and the handling of the device is simple. For example, the device can be attached to the printed wiring board 37 by the one-touch operation of the snaps 43 and 44.

Figure 7:
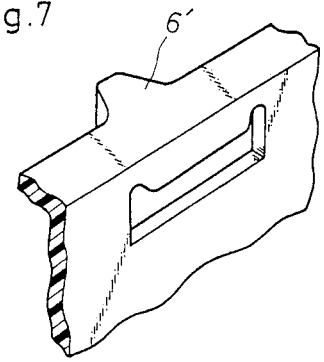
FIG. 7 shows an oblique view indicating another construction of a projection 6.

Although the projections 6 as positioning members in this embodiment are of an elastic cantilever construction which makes much easier to fix the electronic display 2, a frame shown in FIG. 7 may be preferably provided to have a construction as a beam supported at both the ends.

Although the snaps 43 and 44 furnished with arrowhead-shaped check elements at the tips of the snaps are used as support members for the fixation device in this embodiment, other snaps of any conventional releasable fixation type may be used instead.

It will be understood from the above detailed description that the electronic display fixation device provided according to the present invention has an excellent effect that the electronic display can be easily and exactly mounted in a desired position on the printed wiring board or the like by a simple operation. Since the electronic display is firmly fixed in both the directions of its length and height, no excessive force acts to the terminals of the display and the display is stably mounted. Because the electronic display is mounted on the printed wiring board by the support members, the occupied area is reduced to heighten the density of mounting of displays on the printed wiring board.

Obviously, numerous modifications and variations of the present invention are possible in the light of the above teachings. It is therefore understood that within the scope of the appended claims, the invention may be practiced otherwise than as specifically described herein.

What is claimed is:

1. A device for fixing an electronic display, in which the platelike electronic display (2) is put on a flat platelike rest (1) and supported on a printed wiring board (37) by support members (43 and 44) and comprising:

holding members (11 and 12) which are integrally conjoined to a pair of opposed edges of the platelike rest (1) by flexible coupling portions (8 and 9) and which are bent to hold the electronic display (2) after the display (2) is put on the rest (1);

engaging elements (15, 16, 17 and 18) provided on the holding members (11 and 12) and engaged with engaging members (21, 22, 23 and 24) provided on the platelike rest (1), to fix the bent holding members (11 and 12);

positioning members (6) which project from another edge of the platelike rest (1) and with which an edge of the electronic display (2) is brought into contact; and clamping members (28 and 29) which are provided on the holding members (11 and 12) and which are brought into pressure contact with the ends of the electronic display (2) from opposite the positioning members (6) when the holding members (11 and 12) are bent to hold the display (2).

2. A device for fixing an electronic display, as claimed in claim 1, wherein the positioning members (6) are elastic.

3. A device for fixing an electronic display, as claimed in claim 2, wherein the holding members (11 and 12) are integrally conjoined to the platelike rest (1) by the thin coupling portions (8 and 9).

4. A device for fixing an electronic display as claimed in claim 1, wherein a terminal-holding frame (7) having insertion holes for the terminals of the electronic display is provided at an edge of the platelike rest (1).

5. A device for fixing an electronic display, as claimed in claim 1, wherein the support members (43 and 44) are plural snaps which are protrusively provided on the back of the platelike rest (1) and inserted into fixation holes provided at prescribed intervals in the printed wiring board (37), to support the platelike rest (1).

6. A device for fixing an electronic display, as claimed in claim 1, wherein projections (28 and 29) are provided on the holding members (11 and 12).

7. A device for fixing an electronic display, as claimed in claim 1, wherein a reinforcing rib (40) having a prescribed height and width to keep a prescribed vertical distance between the platelike rest (1) and the printed wiring board (37) is provided on the halfway portion of the back of the rest (1).

8. A device for fixing an electronic display, as claimed in claim 1, wherein snaps (43 and 44) and support legs (46 and 47) are integrally provided on the platelike rest (1) at both the ends of the back of the fixation device (1); and arrowhead-shaped check elements are provided at the tips of the snaps (43 and 44).

* * * * *